United States Patent
Zhang et al.

(10) Patent No.: US 9,529,031 B2
(45) Date of Patent: Dec. 27, 2016

(54) GROUNDING DETECTION DEVICE AND METHOD

(71) Applicant: Emerson Network Power Co., Ltd., Shenzhen (CN)

(72) Inventors: Tianzhu Zhang, Shenzhen (CN); Longwen Hu, Shenzhen (CN); Zhiyi You, Shenzhen (CN)

(73) Assignee: Emerson Network Power, Energy Systems, North America, Inc., Warrenville, IL (US)

( * ) Notice: Subject to any disclaimer, the term of this patent is extended or adjusted under 35 U.S.C. 154(b) by 377 days.

(21) Appl. No.: 14/153,790

(22) Filed: Jan. 13, 2014

(65) Prior Publication Data

US 2014/0266234 A1  Sep. 18, 2014

(30) Foreign Application Priority Data

Mar. 15, 2013 (CN) .......................... 2013 1 0083793

(51) Int. Cl.
*G01R 31/02* (2006.01)

(52) U.S. Cl.
CPC .................. *G01R 31/025* (2013.01)

(58) Field of Classification Search
USPC ............... 324/509, 508, 541, 544, 551, 510, 500,324/765.01, 557, 523, 555, 522, 525, 537; 361/42; 340/649; 702/58, 59
See application file for complete search history.

(56) References Cited

U.S. PATENT DOCUMENTS

| | | | | |
|---|---|---|---|---|
| 2011/0080676 | A1* | 4/2011 | Yoshida | G01R 31/025 361/30 |
| 2011/0227584 | A1* | 9/2011 | Beck | G01R 31/129 324/551 |
| 2012/0119755 | A1 | 5/2012 | Ishii et al. | |
| 2013/0088240 | A1* | 4/2013 | Hofheinz | G01R 27/18 324/509 |

FOREIGN PATENT DOCUMENTS

| | | | | |
|---|---|---|---|---|
| CN | 201562395 U | * | 8/2010 | ............. G09B 25/02 |
| CN | 102830283 | | 12/2012 | |
| CN | WO 2012171444 A1 | * | 12/2012 | ............. G01R 31/40 |
| CN | 103018614 | | 4/2013 | |

* cited by examiner

*Primary Examiner* — Melissa Koval
*Assistant Examiner* — Nasima Monsur
(74) *Attorney, Agent, or Firm* — Harness, Dickey & Pierce, P.L.C.

(57) ABSTRACT

There is provided a grounding detection device and method. The grounding detection device may include an insulation tester and a grounding resistance providing unit. The insulation tester may be mounted in a first cabinet, electrically connected to a positive busbar and a negative busbar to detect an equivalent busbar-to-ground resistance, and grounded via the first cabinet. The grounding resistance providing unit may be mounted at least in part in a second cabinet different from the first cabinet, electrically connected to at least one of the positive busbar and the negative busbar to provide a grounding resistance, and grounded via the second cabinet. The insulation tester may determine, based on resistance values of the equivalent busbar-to-ground resistance and the grounding resistance, whether there is a ground fault or not for the insulation tester, the first cabinet, and the second cabinet.

20 Claims, 5 Drawing Sheets

GROUNDING DETECTION DEVICE AND METHOD

CROSS-REFERENCE TO RELATED APPLICATION

This application claims the benefit and priority of Chinese Patent Application No. 201310083793.3 filed Mar. 15, 2013. The entire disclosure of the above application is incorporated herein by reference.

FIELD OF THE INVENTION

The present disclosure relates to the field of a high voltage direct current (HVDC) power supply system, and particularly to a grounding detection device and method for detecting a ground fault in the HVDC power supply system.

BACKGROUND OF THE INVENTION

This section provides background information related to the present disclosure, which is not necessarily the prior art.

In a HVDC power supply system, since there are risks of some serious problems, such as equipment damage or personal safety, caused by dropping of an insulation busbar-to-ground resistance for a positive or negative busbar, a method capable of accurately detecting the insulation resistance is required for the HVDC power supply system. However, in the process of insulation resistance detection, good grounding is the premise of ensuring the accurate detection of insulation resistance. If the grounding is poor, it may lead to no alarm in the case of existence of an insulation fault or a false alarm in the case of normal operation of the system.

Therefore, it is desirable to provide a grounding detection device and method which can determine whether the grounding is good or not. It is also desirable that the grounding detection device and method may accurately measure the insulation resistance.

SUMMARY OF THE INVENTION

This section provides an overview of the present disclosure, rather than a full disclosure of all the scope or all the features of the present disclosure.

The present disclosure provides a grounding detection device and method capable of effectively detecting whether there is a ground fault or not. Based on the judgment on whether there is a ground fault or not, it may be determined more accurately whether there is an insulation resistance fault or not.

According to an aspect of the present disclosure, there is provided a grounding detection device. The grounding detection device may include an insulation tester and a grounding resistance providing unit. The insulation tester may be mounted in a first cabinet, electrically connected to a positive busbar and a negative busbar to detect an equivalent busbar-to-ground resistance, and grounded via the first cabinet. The grounding resistance providing unit may be mounted at least in part in a second cabinet different from the first cabinet, electrically connected to at least one of the positive busbar and the negative busbar to provide a grounding resistance, and grounded via the second cabinet. The insulation tester may determine, based on resistance values of the equivalent busbar-to-ground resistance and the grounding resistance, whether there is a ground fault or not for the insulation tester, the first cabinet and the second cabinet.

According to another aspect of the present disclosure, there is provided a grounding detection device. The grounding detection device may include an insulation tester and a grounding resistance providing unit. The insulation tester may be mounted in a first cabinet, electrically connected to a positive busbar and a negative busbar to detect an equivalent busbar-to-ground resistance, and grounded via the first cabinet. The grounding resistance providing unit may be mounted at least in part in the first cabinet, electrically connected to at least one of the positive busbar and the negative busbar to provide a grounding resistance, and grounded via the first cabinet. The insulation tester may determine, based on resistance values of the equivalent busbar-to-ground resistance and the grounding resistance, whether there is a ground fault or not for the insulation tester.

According to further another aspect of the present disclosure, there is provided a grounding detection method. In the grounding detection method, an insulation tester is mounted in a first cabinet, such that the insulation tester is electrically connected to a positive busbar and a negative busbar to detect an equivalent busbar-to-ground resistance and is grounded via the first cabinet. At least part of a grounding resistance providing unit is mounted in a second cabinet different from the first cabinet, such that the grounding resistance providing unit is electrically connected to at least one of the positive busbar and the negative busbar to provide a grounding resistance and is grounded via the second cabinet. Based on resistance values of the equivalent busbar-to-ground resistance and the grounding resistance, it is determined whether there is a ground fault or not for the insulation tester, the first cabinet and the second cabinet.

According to still another aspect of the present disclosure, there is provided a grounding detection method. In the grounding detection method, an insulation tester is mounted in a first cabinet, such that the insulation tester is electrically connected to a positive busbar and a negative busbar to detect an equivalent busbar-to-ground resistance and is grounded via the first cabinet. At least part of a grounding resistance providing unit is mounted in the first cabinet, such that the grounding resistance providing unit is electrically connected to at least one of the positive busbar and the negative busbar to provide a grounding resistance and is grounded via the first cabinet. Based on resistance values of the equivalent busbar-to-ground resistance and the grounding resistance, it is determined whether there is a ground fault or not for the insulation tester.

In the grounding detection device and method according to the present disclosure, a grounding resistance providing unit is provided to provide a grounding resistance. The grounding resistance can be known in advance. When there is no ground fault for the first cabinet and the second cabinet, the overall cabinet-to-ground resistance for the first cabinet and the second cabinet is no longer infinite, and instead is associated with the known grounding resistance. On the other hand, when there is a ground fault for the first cabinet and the second cabinet, for example, when the first cabinet and the second cabinet are disconnected from the ground, the overall cabinet-to-ground resistance for the first cabinet and the second cabinet becomes infinite. Therefore, with the grounding detection device and method according to the present disclosure, it can be effectively detected whether there is a ground fault or not. When there is no ground fault, it can be further detected accurately whether there is an insulation resistance fault or not.

According to the description herein, further applicable fields will become apparent. The description and specific examples in the summary are only for illustrative purposes and are not intended to limit the scope of the present disclosure.

BRIEF DESCRIPTION OF THE DRAWINGS

The drawings described herein are only for illustrating the selected embodiment rather than illustrating all possible implementations, and are not intended to limit the scope of the present disclosure. In the drawings.

Although the present disclosure is easily subjected to various modifications and alternatives, particular embodiments thereof have been shown in the drawings as examples and are described in detail herein. However, it should be understood that the description of the particular embodiments herein is not intended to limit the present disclosure to a specific form disclosed, and on the contrary, the present disclosure is intended to cover all modifications, equivalents, and alternatives falling within the spirit and scope of the present disclosure. It should be noted that, throughout the drawings, corresponding reference numerals indicate corresponding parts.

DETAILED DESCRIPTION OF THE INVENTION

The examples of the present disclosure are fully described now with reference to the drawings. The following description is merely exemplary and is not intended to limit the present disclosure, application, or use.

Exemplary embodiments are provided to make the present disclosure be described in more detail, and fully convey its scope to those skilled in the art. Various specific details, such as examples of specific parts, device and method, are illustrated to provide a thorough understanding of the present disclosure. It will be apparent for those skilled in the art that, the exemplary embodiments can be used implemented in many different forms, without using specific details, neither of them should not be construed as limiting the scope of the present disclosure. In certain exemplary embodiments, well-known processes, well-known structures and well-known techniques are not described in detail.

Figure 1:
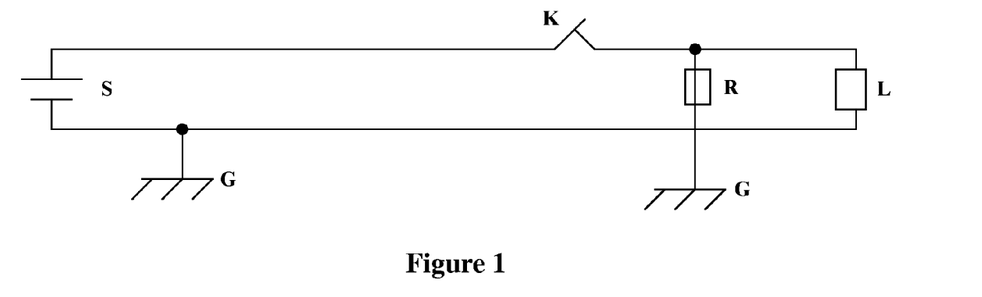
FIG. 1 is a schematic diagram illustrating an example that an insulation resistance fault causes false tripping of a switch.

In the following, possible problems caused by an insulation resistance fault are described firstly with reference to FIGS. 1 and 2. As shown in FIG. 1, a power supply S supplies power to a load L via a switch K. Considering that insulation faults at multiple points may occur for the power supply S, if an insulation fault of short to ground occurs at the negative pole of the power supply S and at the same time an insulation fault of dropping of resistance to ground occurs in a connection line between the switch K and the load L, then a positive connection wire of the power supply S is grounded via an insulation resistor R. When the resistance value of the insulation resistor R is much less than the resistance value of the load L, the load L is bypassed, resulting in false tripping of the switch K.

Figure 2:
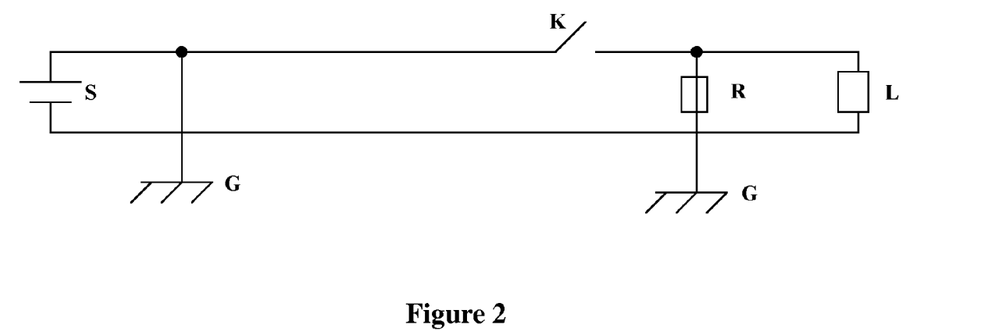
FIG. 2 is a schematic diagram illustrating an example that an insulation resistance fault causes false turn-on of a load.

Further, as shown in FIG. 2, the switch K is turned off, and therefore the power supply S supplies no power to the load L. Considering that insulation faults at multiple points may occur for the power supply S, if an insulation fault of short to ground occurs at the positive pole of the power supply S and at the same time an insulation fault of dropping of resistance to ground occurs in the connection line between the switch K and the load L, then the connection line of the load L is grounded via the insulation resistor R. Thus, a loop is formed by the power supply S and the insulation resistor R and the load L via the ground G, thereby causing false turn-on of the load L.

In addition to causing damage to the equipment, the false tripping of the switch and the false turn-on of the load may cause personal safety issues, which should be avoided as far as possible. It is necessary to issue an alarm in the event of an insulation resistance fault. However, if a ground fault occurs before the insulation resistance fault occurs, the subsequently occurred insulation resistance fault might be unable to be detected. This will be described in detail below. Therefore, if it can be detected in advance whether there is a ground fault or not, it can be more accurately detected whether there is an insulation resistance fault or not.

Figure 3:
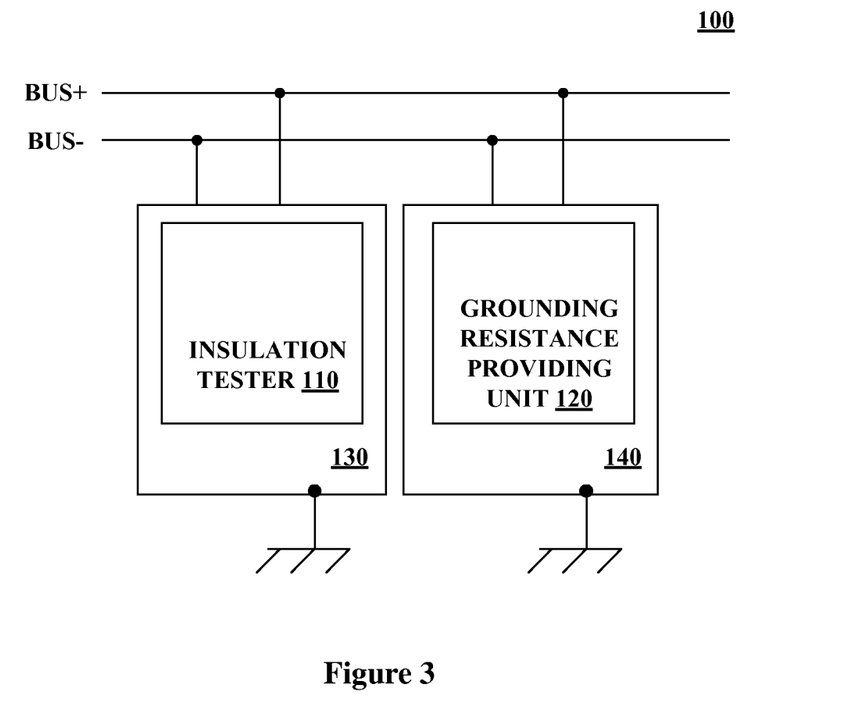
FIG. 3 is a block diagram illustrating a grounding detection device according to an embodiment of the present disclosure.

As shown in FIG. 3, a grounding detection device 100 according to an embodiment of the present disclosure may include an insulation tester 110 and a grounding resistance providing unit 120.

The insulation tester 110 is mounted in a cabinet 130. The insulation tester 110 is electrically connected to a positive busbar BUS+ and a negative busbar BUS− to detect an equivalent busbar-to-ground resistance, and is grounded via the cabinet 130.

The grounding resistance providing unit 120 is mounted at least in part in a cabinet 140. The grounding resistance providing unit 120 is electrically connected to at least one of the positive busbar BUS+ and the negative busbar BUS− to provide a grounding resistance, and is grounded via the cabinet 140.

According to an embodiment of the present disclosure, it can be determined, based on the resistance value of the equivalent busbar-to-ground resistance detected by the insulation tester 110 and the resistance value of the grounding resistance provided by the grounding resistance providing unit 120, whether there is a ground fault or not for the insulation tester 110, the cabinet 130 and the cabinet 140.

It is appreciated by those skilled in the art that the insulation tester 110 can be used to detect an insulation busbar-to-ground resistance for the positive busbar BUS+ and the negative busbar BUS−. In the case where there is no grounding resistance provided by the grounding resistance providing unit 120, when the insulation tester 110, the cabinet 130 and the cabinet 140 have good grounding and the positive busbar BUS+ and the negative busbar BUS− have good insulation, the insulation busbar-to-ground resistance for the positive busbar BUS+ and the negative busbar BUS− detected by the insulation tester 110 is infinite in theory. On the other hand, when there is a ground fault in the insulation tester 110, the cabinet 130 and the cabinet 140, such as being disconnected from the ground, whatever the positive busbar BUS+ and the negative busbar BUS− have good insulation or not, in theory, the insulation busbar-to-ground resistance for the positive busbar BUS+ and the negative busbar BUS− detected by the insulation tester 110 is still infinite. In other words, in the case where there is no grounding resistance provided by the grounding resistance providing unit 120, it is unable to detect, by the insulation tester 110, whether there is a ground fault or not for the insulation tester 110, the cabinet 130 and the cabinet 140.

In contrast, in the case where there is a grounding resistance provided by the grounding resistance providing unit 120, when the insulation tester 120, the cabinet 130 and the cabinet 140 have good grounding and the positive busbar BUS+ and the negative busbar BUS− have good insulation, the insulation busbar-to-ground resistance for the positive busbar BUS+ and the negative busbar BUS− detected by the insulation tester 110 is theoretically equal to the resistance value of the grounding resistance provided by the grounding resistance providing unit 120. On the other hand, when there is a ground fault in the insulation tester 110, the cabinet 130 and the cabinet 140, such as being disconnected from the ground, the insulation busbar-to-ground resistance for the positive busbar BUS+ and the negative busbar BUS− detected by the insulation tester 110 is infinite in theory since the grounding resistance provided by the grounding resistance providing unit 120 can not be detected. Thus, based on the detection result of the insulation tester 110 and the resistance value of the grounding resistance provided by the grounding resistance providing unit 120, it can be determined whether there is a ground fault or not for the insulation tester 110, the cabinet 130 and the cabinet 140.

Figure 4:
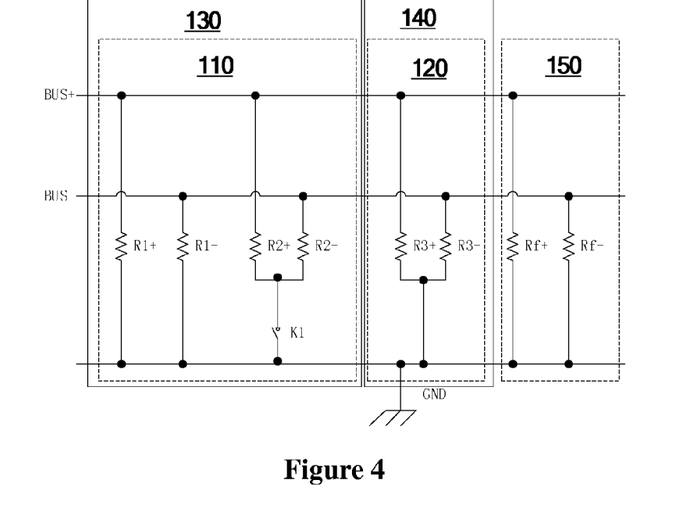
FIG. 4 is a circuit diagram illustrating an example of a grounding detection device according to an embodiment of the present disclosure.

In the following, an example of the insulation tester according to an embodiment of the present disclosure is further described by taking a circuit diagram shown in FIG. 4 as an example. As shown in FIG. 4, the insulation tester 110 mounted in the cabinet 130 may include resistors R1+, R1−, R2+ and R2− and a switch K1.

The resistor R1+ is electrically connected between the positive busbar BUS+ and a ground wire, and the resistor R1− is electrically connected between the negative busbar BUS− and the ground wire. One terminal of the resistor R2+ is electrically connected to the positive busbar BUS+, and the other terminal of the resistor R2+ is electrically connected to the switch K1. One terminal of the resistor R2− is electrically connected to the negative busbar BUS−, and the other terminal of the resistor R2− is electrically connected to the switch K1. The switch K1 is electrically connected to the ground wire.

It should be noted that, the insulation tester 110 shown in FIG. 4 is only an example, and the present disclosure is not limited to this particular example. The technical solution of the present disclosure is also applicable to other types of insulation testers known to those skilled in the art.

In the case where the switch K1 is turned off, only the resistors R1+ and R1− are switched in, and the resistors R2+ and R2− are not switched in. In this case, the insulation tester 110 can obtain a busbar-to-ground voltage U1 for the positive busbar BUS+ and a busbar-to-ground voltage U2 for the negative busbar BUS−. Further, in the case where the switch K1 is turned on, the resistors R1+, R1−, R2+ and R2− are all switched in. In this case, the insulation tester 110 can obtain a busbar-to-ground voltage U1' for the positive busbar BUS+ and a busbar-to-ground voltage U2' for the negative busbar BUS−. Based on the busbar-to-ground voltages U1, U2, U1' and U2', the equivalent busbar-to-ground resistance for the positive busbar R+ and the equivalent busbar-to-ground resistance for the negative busbar R− can be calculated by the following linear equations with two unknowns, i.e., equation (1), as a detection result of the insulation tester 110:

$$\begin{cases} \dfrac{U2}{R1-//R-} = \dfrac{U1}{R1+//R+} \\ \dfrac{U2'}{R1-//R2-//R-} = \dfrac{U1'}{R1+//R2+//R+} \end{cases} \quad (1)$$

where the operator "//" means "being connected in parallel".

Referring to FIG. 4 again, the grounding resistance providing unit 120 mounted in the cabinet 140 may include resistors R3+ and R3−. The resistor R3+ is electrically connected between the positive busbar BUS+ and the ground wire, and the resistor R3− is electrically connected between the negative busbar BUS− and the ground wire.

In addition, FIG. 4 also illustrates an equivalent fault resistance 150 in the case where the positive busbar BUS+ or the negative busbar BUS− has an insulation fault. The fault resistance 150 includes a resistance Rf+ electrically connected between the positive busbar BUS+ and the ground wire and a resistance Rf− electrically connected between the negative busbar BUS− and the ground wire.

The following equation (2) can be easily obtained from FIG. 4:

$$\begin{cases} R+ = R3+ // Rf+ \\ R- = R3- // Rf- \end{cases} \quad (2)$$

Since the calculated resistance R+ is obtained from the resistance R3+ and the resistance Rf+ connected in parallel and the calculated resistance R− is obtained from the resistance R3− and the resistance Rf− connected in parallel, the calculated R+ will not be greater than the resistance R3+, and the calculated resistance R− will not be greater than the resistance R3−.

The case where no ground fault occurs is described above. On the other hand, in the case where a ground fault occurs, for example, when the cabinet where the grounding resistance providing unit 120 and the fault resistance 150 are located is disconnected from the ground wire, the resistances R+ and R− calculated from above equation (1) does not satisfy the equation (2) any longer. In fact, the resistances R+ and R− calculated from the above equation (1) will be much greater than the resistances R3+ and R3−. This will be described below by means of a specific example.

Assuming that the voltage drop between the positive busbar BUS+ and the negative busbar BUS− is equal to 266 V. Let the resistance value of each of the resistors R1+ and R1− be 200 kΩ, the resistance values of the resistors R2+ and R2− be 300 kΩ and 400 kΩ, respectively, and the resistance value of each of the resistors R3+ and R3− be 600 kΩ.

In the case of good grounding and good insulation (both resistance Rf+ and resistance Rf− are infinite), in the case where the switch K1 is turned off, a busbar-to-ground voltage U1 for the positive busbar BUS+ read from the insulation tester 110 is equal to 133 V, and a busbar-to-ground voltage U2 for the negative busbar BUS− read from the insulation tester 110 is equal to 133 V. In the case where the switch K1 is turned on, a busbar-to-ground voltage U1' for the positive busbar BUS+ read from the insulation tester 110 is equal to 127.2 V, and a busbar-to-ground voltage U2' for the negative busbar BUS− read from the insulation tester 110 is equal to 138.8 V.

Based on the above data, an equivalent busbar-to-ground resistance R+ for the positive busbar can be calculated from the equation (1), which is equal to 600 kΩ, and an equivalent busbar-to-ground resistance R− for the negative busbar calculated is equal to 600 kΩ.

Considering the case where there is good grounding and an insulation fault. Assuming that the resistance Rf+ is still infinite but the resistance Rf− is 10 kΩ. In this case, in the case where the switch K1 is turned off, the busbar-to-ground voltage U1 for the positive busbar BUS+ read from the insulation tester 110 is equal to 250.4 V, and the busbar-to-ground voltage U2 for the negative busbar BUS− read from the insulation tester 110 is equal to 15.6 V. In the case where the switch K1 is turned on, the busbar-to-ground voltage U1' for the positive busbar BUS+ read from the insulation tester 110 is equal to 243.7 V, and the busbar-to-ground voltage U2' for the negative busbar BUS− read from the insulation tester 110 is equal to 22.3 V.

Based on above data, the equivalent busbar-to-ground resistance R+ for the positive busbar can be calculated from the equation (1), which is equal to 600 kΩ, and the calculated equivalent busbar-to-ground resistance R− for the negative busbar is equal to 9.8 kΩ. Further, the fault resistance Rf+ can be calculated from the equation (2), which is infinite, and the calculated fault resistance Rf− is equal to 10 kΩ.

On the other hand, in the case where there is a ground fault, such as being disconnected from the ground, in the case where the switch K1 is turned off, the busbar-to-ground voltage U1 for the positive busbar BUS+ read from the insulation tester 110 is equal to 133 V, and the busbar-to-ground voltage U2 for the negative busbar BUS− read from the insulation tester 110 is equal to 133 V. In the case where the switch K1 is turned on, the busbar-to-ground voltage U1' for the positive busbar BUS+ read from the insulation tester 110 is equal to 126 V, and the busbar-to-ground voltage U2' for the negative busbar BUS− read from the insulation tester 110 is equal to 140 V.

Based on above data, both the equivalent busbar-to-ground resistance R+ for the positive busbar and the equivalent busbar-to-ground resistance R− for the negative busbar calculated from the equation (1) are infinite.

As known from above example, since the calculated resistance R+ is obtained from the resistance R3+ and the resistance Rf+ connected in parallel, and the calculated resistance R− is obtained from the resistance R3− and the resistance Rf− connected in parallel, then the calculated resistance R+ will not be greater than the resistance R3+, and the calculated resistance R− will not be greater than the resistance R3−. Therefore, if the calculated R+ is greater than the resistance R3+, or the calculated resistance R− is greater than the resistance R3−, it can be determined that a ground fault has occurred.

Further, if the calculated R+ is less than the resistance R3+ and the calculated resistance R− is less than the resistance R3−, since the resistance R3+ and the resistance R3− are both determined values, the fault resistance Rf+ and the fault resistance Rf− can be calculated from the equation (2). Then, it can be judged whether there is an insulation fault or not, according to the resistance values of the fault resistance Rf+ and the fault resistance Rf−.

The data given in the example above is merely illustrative. In fact, considering factors such as test error, in the case of good grounding and good insulation, the equivalent busbar-to-ground resistance R+ for the positive busbar and the equivalent busbar-to-ground resistance R− for the negative busbar calculated from the equation (1) based on the detection result of the insulation tester 110 may not be exactly equal to the resistances R3+ and R3−. In addition, in the event of a ground fault such as that grounding is broken, the equivalent busbar-to-ground resistance R+ for the positive busbar and the equivalent busbar-to-ground resistance R− for the negative busbar calculated from the equation (1) would not be infinity.

For example, let the resistance value of each of the resistors R1+ and R1− be 200 kΩ, the resistance value of the resistors R2+ and R2− be 300 kΩ and 400 kΩ, respectively, and the resistance value of each of the resistors R3+ and R3− be 600 kΩ. By specific experiments by the inventor, in the case of good grounding and good insulation, both the equivalent busbar-to-ground resistance R+ for the positive busbar and the equivalent busbar-to-ground resistance R− for the negative busbar calculated from the equation (1) are equal to about 580 kΩ, rather than equal to the resistance value of 600 kΩ of the resistors R3+ and R3−. In addition, in the case where the grounding is broken, both the equivalent busbar-to-ground resistance R+ for the positive busbar and the equivalent busbar-to-ground resistance R− for the negative busbar calculated from the equation (1) by the inventor are greater than 2000 kΩ.

Therefore, in actual operation, when the resistance value of each of the resistor R3+ and R3− is 600 kΩ, considering the test error, for example, 700 kΩ can be selected to be a predetermined threshold to judge whether there is good grounding. When both the equivalent busbar-to-ground resistance R+ for the positive busbar and the equivalent busbar-to-ground resistance R− for the negative busbar are less than the predetermined threshold associated with the resistance values of the resistors R3+ and R3−, it can be determined that there is no ground fault in the insulation tester 110, the cabinet 130 where the insulation tester 110 is located, and the cabinet 140 where the grounding resistance providing unit 120 is located. On the other hand, when any one of the equivalent busbar-to-ground resistance R+ for the positive busbar and the equivalent busbar-to-ground resistance R− for the negative busbar is greater than or equal to the predetermined threshold, it can be determined that there is a ground default for at least one of the insulation tester 110, the cabinet 130 and the cabinet 140.

In addition, in order to cause the busbar-to-ground voltages for the positive busbar and the negative busbar to be changed after the switch K1 is turned on, the resistors R1+, R1−, R2+ and R2− in the insulation tester 110 should be selected such that the ratio of the resistance value of the resistor R1+ to the resistance value of the resistor R1− is different from the ratio of the parallel resistance of the resistor R1+ and the resistor R2+ to the parallel resistance of the resistor R1− and the resistor R2−.

Considering the balance between the busbar-to-ground voltage for the positive busbar and the busbar-to-ground voltage for the negative busbar, preferably, the resistor R1+ and the resistor R1− should be selected such that the resistance value of the resistor R1+ is equal to the resistance value of the resistor R1−. In this case, the resistance value of the resistor R2+ should not be equal to the resistance value of the resistor R2−. Of course, if in actual operation it does not need to consider the balance between the busbar-to-ground voltage for the positive busbar and the busbar-to-ground voltage for the negative busbar, it is also possible to select the resistor R1+ and the resistor R1− such that the resistance value of resistor R1+ is not equal to the resistance value of the resistor R1−.

In addition, the grounding resistance providing unit 120 shown in FIG. 4 provides two grounding resistors R3+ and R3−. However, the grounding resistance providing unit 120 can also provide only one of the grounding resistors R3+ and R3−.

For example, when the grounding resistance providing unit 120 provides only the grounding resistor R3+, similarly, the equivalent busbar-to-ground resistance R+ for the positive busbar and the equivalent busbar-to-ground resistance R− for the negative busbar can also be calculated based on the detection result of the insulation tester 110. In the case of good grounding and good insulation, in theory, the equivalent busbar-to-ground resistance R+ for the positive busbar calculated is 600 kΩ, and the equivalent busbar-to-ground resistance R− for the negative busbar calculated is infinite. In the event of a ground fault such as that grounding is broken, both the equivalent busbar-to-ground resistance R+ for the positive busbar and the equivalent busbar-to-ground resistance R− for the negative busbar calculated in theory are infinite.

Correspondingly, when the grounding resistance providing unit 120 provides only the grounding resistor R3−, similarly, the equivalent busbar-to-ground resistance R+ for the positive busbar and the equivalent busbar-to-ground resistance R− for the negative busbar can also be calculated based on the detection result of the insulation tester 110. In the case of good grounding and good insulation, in theory, the calculated equivalent busbar-to-ground resistance R+ for the busbar is infinite and the calculated equivalent busbar-to-ground resistance R− for the negative busbar is 600 kΩ. In the event of a ground fault such as that the grounding is broken, both the equivalent busbar-to-ground resistance R+ for the positive busbar and the equivalent busbar-to-ground resistance R− for the negative busbar calculated in theory are infinite.

Accordingly, when the equivalent busbar-to-ground resistance R+ for the positive busbar is less than the predetermined threshold associated with the resistance value of the grounding resistance R3+ or the equivalent busbar-to-ground resistance R− for the negative busbar is less than the predetermined threshold associated with the resistance value of the grounding resistance R3−, it can be determined that there is no ground fault for the insulation tester 110, the cabinet 130 where the insulation tester 110 is located, and the cabinet 140 where the grounding resistance providing unit 120 is located. On the other hand, when both the equivalent busbar-to-ground resistance R+ for the positive busbar and the equivalent busbar-to-ground resistance R− for the negative busbar are greater than or equal to the predetermined threshold, it can be determined that there is a ground fault for at least one of the insulation tester 110, the cabinet 130 and the cabinet 140.

In addition, in the grounding resistance providing unit 120 shown in FIGS. 3 and 4, the two grounding resistors R3+ and R3 are arranged in the same cabinet 140. However, the grounding resistors R3+ and R3− can also be arranged in different cabinets. Thus, when both the equivalent busbar-to-ground resistance R+ for the positive busbar and the equivalent busbar-to-ground resistance R− for the negative busbar are less the predetermined threshold, it can be determined that there is no ground fault for the insulation tester 110, the cabinet 130 where the insulation tester 100 is located, and the different cabinets where the two grounding resistors R3+ and R3− are located. On the other hand, when any one of the equivalent busbar-to-ground resistance R+ for the positive busbar and the equivalent busbar-to-ground resistance R− for the negative busbar is greater than or equal to the predetermined threshold, it can be determined that there is a grounding fault for at least one of the insulation tester 110, the cabinet 130 and the different cabinets where the two grounding resistors R3+ and R3− are located.

Figure 5:
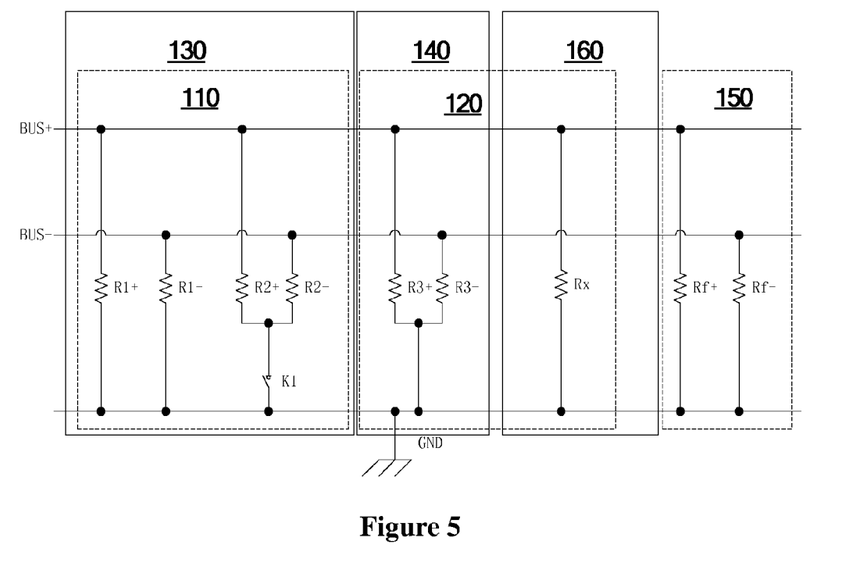
FIG. 5 is a circuit diagram illustrating another example of the grounding detection device according to an embodiment of the present disclosure.

Further, in addition to the grounding resistors R3+ and/or R3−, the grounding resistance providing unit 120 can further provide at least one other grounding resistor Rx, as shown in FIG. 5. The grounding resistor Rx can be mounted in at least one other cabinet 160 different from both of the cabinet 130 and the cabinet 140, and is electrically connected between the ground wire and one of the positive busbar BUS+ and the negative busbar BUS−. In FIG. 5, the grounding resistor Rx is electrically connected between the positive busbar BUS+ and the ground wire. A parallel connection relationship is formed between the grounding resistor Rx and the grounding resistor R3+, thus forming a determined grounding resistance.

For example, based on the specific example given above in FIG. 4, it is further assumed that the grounding resistor Rx mounted in the cabinet 160 has a resistance value of 600 kΩ and is electrically connected between the positive busbar BUS+ and the ground wire. In the case of good ground and good insulation, in theory, the calculated equivalent busbar-to-ground resistance R+ for the positive busbar is 300 kΩ and the calculated equivalent busbar-to-ground resistance R− for the negative busbar is 600 kΩ. In the case that the grounding of the cabinet 140 is broken, in theory, the calculated equivalent busbar-to-ground resistance R+ for the positive busbar is 600 kΩ and the calculated equivalent busbar-to-ground resistance R− for the negative busbar is infinite. In the case that the grounding of the cabinet 140 and the grounding of the cabinet 160 where the grounding resistor Rx is located are both broken, in theory, both the calculated equivalent busbar-to-ground resistance R+ for the positive busbar and the calculated equivalent busbar-to-ground resistance R− for the negative busbar are infinite. In the case that the grounding of the cabinet 160 where the grounding resistor Rx is located is broken, in theory, both the calculated equivalent busbar-to-ground resistance R+ for the positive busbar and the calculated equivalent busbar-to-ground resistance R− for the negative busbar are equal to 600 kΩ.

Therefore, as long as the predetermined threshold associated with the resistance values of the grounding resistors R3+, R3− and Rx is appropriately set, it is possible to determine whether there is a ground fault or not for the insulation tester 110 and the cabinets where the respective grounding resistors are located. For example, considering the test error, the predetermined threshold associated with the grounding resistors R3+ and Rx can be set to be 400 kΩ, and the predetermined threshold associated with the grounding resistor R3− can be set to be 700 kΩ. Thus, when the equivalent busbar-to-ground resistance R+ for the positive busbar is less than 400 kΩ and the equivalent busbar-to-ground resistance R− for the negative busbar is less than 700 kΩ, it can be determined that there is no ground fault for the insulation tester 110 and the cabinets where the respective grounding resistors are located. On the other hand, when the equivalent busbar-to-ground resistance R+ for the positive busbar is greater than or equal to 400 kΩ or the equivalent busbar-to-ground resistance R− for the negative busbar is greater than or equal to 700 kΩ, it can be determined that there is a ground fault for at least one of the insulation tester 110 and the cabinets where the respective grounding resistors are located.

It should be noted that, when the number of the grounding resistors provided in the grounding resistance providing unit 110 is increased, the overall grounding resistance provided by the grounding resistance providing unit 120 will be decreased due to the parallel connection of the grounding resistors. Therefore, in selection of the grounding resistors, one should be careful not to cause an insulation fault after the grounding resistors are connected in parallel. In addition, in selection of resistors in the insulation tester 110, the same problem should be considered.

Considering the balance between the busbar-to-ground voltage for the positive busbar and the busbar-to-ground voltage for the negative busbar, preferably, the resistance value of the grounding resistor R3+ should be selected to be equal to the resistance value of the grounding resistor R3−.

In addition, the above-mentioned cabinets 130, 140 and 160 can be any one of the cabinets at the direct current side of the HVDC power supply system, such as a direct current distribution cabinet and a secondary distribution cabinet, to which the present disclosure has no special limitation.

Figure 6:
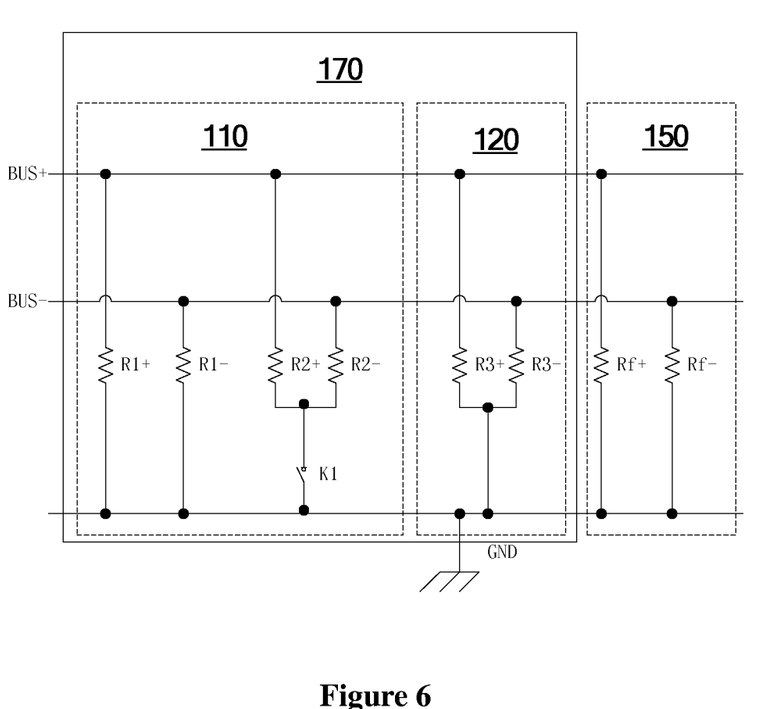
FIG. 6 is a circuit diagram illustrating another example of the grounding detection device according to an embodiment of the present disclosure.

In FIGS. 3-5, the insulation tester 110 and the grounding resistance providing unit 120 are located in different cabinets 130 and 140. However, at least part of the grounding resistance providing unit 120 and the insulation tester 110 can be located in the same cabinet, as shown in FIG. 6. It should be noted that the grounding resistor provided in the grounding resistance providing unit 120 can not be directly electrically connected to the input port of the insulation tester 110. Otherwise, no matter whether a ground fault occurs or not for the insulation tester 110, the insulation tester 110 is always able to detect the grounding resistor in the grounding resistance providing unit 120, and thus it is unable to determine whether there is a ground fault or not for the insulation tester 110.

It should be noted that, as shown in FIG. 6, when the grounding resistance providing unit 120 and the insulation tester 110 are mounted in a same cabinet 170, since both the grounding resistance providing unit 120 and the insulation tester 110 are grounded via the cabinet 170, it is unable to determine whether there is a ground fault or not for the cabinet 170, but it can be determined at least whether there is a ground fault or not for the insulation tester 110. The specific determination way is the same as that described above with reference to FIGS. 3-5, which will not be described in detail herein.

In addition, when a part of the grounding resistance providing unit 120 such as the grounding resistor R3+ or R3− or another grounding resistor Rx (see FIG. 5) is mounted in a cabinet other than the cabinet 170, it can be determined whether there is a ground fault or not for the insulation tester 110, the cabinet 170 and another cabinet where the part of the insulation resistance providing unit 120 is located. The specific determination way is the same as that described above with reference to FIGS. 3-5, which will not be described in detail herein.

A grounding detection method according to an embodiment of the present disclosure is described below in conjunction with FIG. 7.

Figure 7:
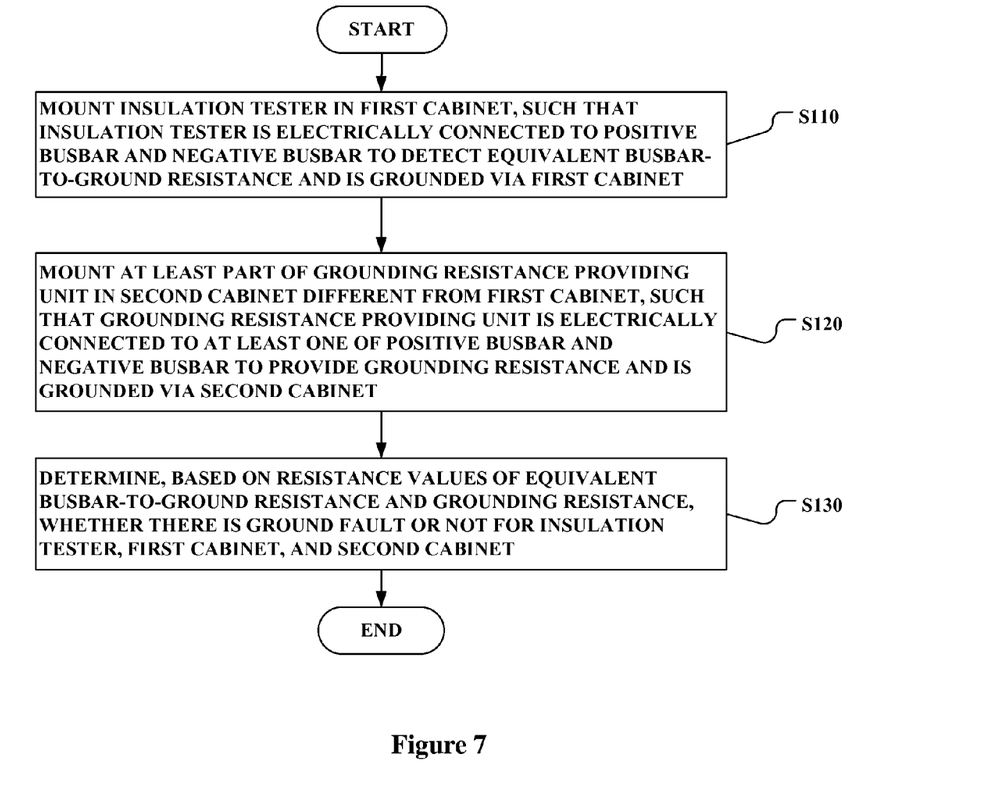
FIG. 7 is a flow chart of a grounding detection method according to an embodiment of the present disclosure.

As shown in FIG. 7, in step S110, an insulation tester is mounted in a first cabinet, such that the insulation tester is electrically connected to a positive busbar and a negative busbar to detect an equivalent busbar-to-ground resistance and is grounded via the first cabinet.

Next, in step S120, at least part of a grounding resistance providing unit is mounted in a second cabinet different from the first cabinet, such that the grounding resistance providing unit is electrically connected to at least one of the positive busbar and the negative busbar to provide a grounding resistance and is grounded via the second cabinet.

Finally, in step S130, it is determined, based on resistance values of the equivalent busbar-to-ground resistance and the grounding resistance, whether there is a ground fault or not for the insulation tester, the first cabinet and the second cabinet.

Referring to FIG. 4 again, according to an embodiment of the present disclosure, in the case where the switch K1 is turned off, a busbar-to-ground voltage U1 for the positive busbar and a busbar-to-ground voltage U2 for the negative busbar can be obtained by the insulation tester 110. In the case where the switch K1 is turned on, a busbar-to-ground voltage U1' for the positive busbar and a busbar-to-ground voltage U2' for the negative busbar can be obtained by the insulation tester 110. The equivalent busbar-to-ground resistance for the positive busbar and the equivalent busbar-to-ground resistance for the negative busbar can be calculated as the detection result of the insulation tester 110 based on the resistance values of the resistors R1+, R1−, R2+ and R2− and based on the busbar-to-ground voltage U1 for the positive busbar, the busbar-to-ground voltage U1' for the positive busbar, the busbar-to-ground voltage U2 for the negative busbar, and the busbar-to-ground voltage U2' for the negative busbar.

According to an embodiment of the present disclosure, a first grounding resistor included in the grounding resistance providing unit can be mounted in the second cabinet, such that the first grounding resistor is electrically connected between a ground wire and one of the positive busbar and the negative busbar.

According to an embodiment of the present disclosure, a second grounding resistor included in the grounding resistance providing unit can be mounted in the second cabinet, such that the second grounding resistor is electrically connected between the ground wire and the other one of the positive busbar and the negative busbar.

According to an embodiment of the present disclosure, the second grounding resistor can also be mounted in a third cabinet different from the second cabinet, such that the second grounding resistor is electrically connected between the ground wire and the other one of the positive busbar and the negative busbar. And, it can be determined, based on resistance values of the equivalent busbar-to-ground resistance and the grounding resistance, whether there is a ground fault or not for the insulation tester, the first cabinet, the second cabinet, and the third cabinet.

According to an embodiment of the present disclosure, at least one other grounding resistor included in the grounding resistance providing unit can be mounted in at least one cabinet different from both the first cabinet and the second cabinet, such that the at least one other grounding resistor is electrically connected between the ground wire and one of the positive busbar and the negative busbar. And, it can be determined, based on resistance values of the equivalent busbar-to-ground resistance and the grounding resistance, whether there is a ground fault or not for the insulation tester, the first cabinet, the second cabinet, and the at least one other cabinet.

According to an embodiment of the present disclosure, if it is determined that there is no ground fault for the first cabinet and the second cabinet, an insulation busbar-toground resistance can be calculated based on the resistance values of the equivalent busbar-to-ground resistance and the grounding resistance.

According to an embodiment of the present disclosure, the insulation busbar-to-ground resistance can be calculated according to a relationship that the equivalent insulation busbar-to-ground resistance is obtained by connecting the insulation busbar-to-ground resistance and the grounding resistance in parallel.

According to an embodiment of the present disclosure, when the insulation busbar-to-ground resistance is less than a predetermined threshold, it is determined that there is a ground fault.

A grounding detection method in the case where the insulation tester and the grounding resistance providing unit are located in different cabinets is described above. In the following, a grounding detection method in the case where the insulation tester and at least part of the grounding resistance providing unit are located in the same cabinet is described.

Firstly, an insulation tester is mounted in a first cabinet, such that the insulation tester is electrically connected to a positive busbar and a negative busbar to detect an equivalent busbar-to-ground resistance and is grounded via the first cabinet. Secondly, at least a part of the grounding resistance providing unit is mounted in the first cabinet, such that the at least part of the grounding resistance providing unit is electrically connected to at least one of the positive busbar and the negative busbar to provide a grounding resistance and is grounded via the first cabinet. Finally, it can be determined, based on resistance values of the equivalent busbar-to-ground resistance and the grounding resistance, whether there is a ground fault or not for the insulation tester.

Referring to FIG. 4 again, according to an embodiment of the present disclosure, in the case where the switch K1 is turned off, a busbar-to-ground voltage U1 for the positive busbar and a busbar-to-ground voltage U2 for the negative busbar can be obtained by the insulation tester 110. In the case where the switch K1 is turned on, a busbar-to-ground voltage U1' for the positive busbar and a busbar-to-ground voltage U2' for the negative busbar can be obtained by the insulation tester 110. The equivalent busbar-to-ground resistance for the positive busbar and the equivalent busbar-to-ground resistance for the negative busbar can be calculated as a detection result of the insulation tester 110 based on the resistance values of the resistors R1+, R1−, R2+ and R2− and based on the busbar-to-ground voltage U1 for the positive busbar, the busbar-to-ground voltage U1' for the positive busbar, the busbar-to-ground voltage U2 for the negative busbar, and the busbar-to-ground voltage U2' for the negative busbar.

According to an embodiment of the present disclosure, a first grounding resistor included in the grounding resistance providing unit can be mounted in the first cabinet, such that the first grounding resistor is electrically connected between a ground wire and one of the positive busbar and the negative busbar.

According to an embodiment of the present disclosure, a second grounding resistor included in the grounding resistance providing unit can be mounted in the first cabinet, such that the second grounding resistor is electrically connected between the ground wire and the other one of the positive busbar and the negative busbar.

According to an embodiment of the present disclosure, the second grounding resistor included in the grounding resistance providing unit can be mounted in a second cabinet different from the first cabinet, such that the second grounding resistor is electrically connected between the ground wire and the other one of the positive busbar and the negative busbar. And, it can be determined, based on resistance values of the equivalent busbar-to-ground resistance and the grounding resistance, whether there is a ground fault or not for the insulation tester, the first cabinet and the second cabinet.

According to an embodiment of the present disclosure, at least one other grounding resistor included in the grounding resistance providing unit can be mounted in at least one other cabinet different from the first cabinet, such that the at least one other grounding resistor is electrically connected between the ground wire and one of the positive busbar and the negative busbar. And, it can be determined, based on resistance values of the equivalent busbar-to-ground resistance and the grounding resistance, whether there is a ground fault or not for the insulation tester, the first cabinet and the at least one other cabinet.

According to an embodiment of the present disclosure, if it is determined that there is no ground fault for the insulation tester, an insulation busbar-to-ground resistance can be calculated based on the resistance values of the equivalent busbar-to-ground resistance and the grounding resistance.

According to an embodiment of the present disclosure, the insulation busbar-to-ground resistance can be calculated based on a relationship that the equivalent busbar-to-ground resistance is obtained by connecting the insulation busbar-to-ground resistance and the grounding resistance in parallel.

According to an embodiment of the present disclosure, in the case where the insulation busbar-to-ground resistance is less than a predetermined threshold, it is determined that there is an insulation fault.

The specific implementation of the above steps of the grounding detection method according to the embodiment of the present disclosure has been described previously, which will not be described in detail herein.

In a multi-cabinet system, the grounding resistance providing unit and the insulation tester can be mounted in the same cabinet to determine whether the insulation tester is well grounded or not. The grounding resistance providing unit and the insulation tester can also be mounted in different cabinets, so that an alarm is generated whatever a ground fault occurs in the insulation tester or the system cabinet has poor grounding.

In the selection of the resistors R1+ and R1− shown in FIG. 4, it is possible to not consider the balance between the busbar-to-ground voltage for the positive busbar and the busbar-to-ground voltage for the negative busbar, therefore it is possible to select resistors R1+ and R1− with different resistance.

When the grounding resistors R3+ and R3− are connected with the positive busbar and the negative busbar in the HVDC power supply system shown in FIG. 4, it is also possible to not consider the balance between the busbar-to-ground voltage for the positive busbar and the busbar-to-ground voltage for the negative busbar. In this case, for the grounding resistors R3+ and R3−, different resistance values can be selected, or only one of the grounding resistors R3+ and R3− is switched in.

According to an embodiment of the present disclosure, by adding a group of busbar-to-ground resistances for the positive busbar and the negative busbar, it is possible to achieve the detection about whether the insulation tester is grounded well or not.

According to an embodiment of the present disclosure, the resistance added in the HVDC power system and the insulation tester can be in the same cabinet, or can be in a different cabinet, so as to achieve different detection purposes.

In the device and method of the present disclosure, obviously, various components or steps can be decomposed and/or re-combined. The decomposition and/or recombination should be regarded as an equivalent scheme of the present disclosure. And the steps for performing a series of processes described above can be performed naturally in time in accordance with the order described, but it is not necessary to be performed in accordance with the time order. Some of the steps can be performed in parallel or performed independently of each other.

Although the embodiments of the present disclosure are described in detail above in conjunction with the drawings, it should be understood that the embodiments described above are only for illustrating the present disclosure, without constituting a limitation to the present disclosure. For those skilled in the art, numerous modifications and variations can be made to the embodiments above without departing from the essence and scope of the present disclosure. Therefore, the scope of the present disclosure is defined by only appended claims and equivalent meanings thereof.

The invention claimed is:

1. A grounding detection device, comprising:
   an insulation tester mounted in a first cabinet, the insulation tester electrically connected to a positive busbar and a negative busbar to detect an equivalent busbar-to-ground resistance of the positive busbar and an equivalent busbar-to-ground resistance of the negative bus bar, the insulation tester grounded via the first cabinet; and
   a grounding resistance providing unit mounted at least in part in a second cabinet different from the first cabinet, the grounding resistance providing unit electrically connected to at least one of the positive busbar and the negative busbar to provide a grounding resistance between ground and at least one of the positive busbar and the negative busbar, the grounding resistance providing unit grounded via the second cabinet,
   wherein the insulation tester is configured to determine, based on resistance values of the equivalent busbar-to-ground resistances and the grounding resistance, whether there is a ground fault for the insulation tester, the first cabinet and the second cabinet.

2. The grounding detection device according to claim 1, wherein the insulation tester is configured to determine that there is no ground fault for the insulation tester, the first cabinet and the second cabinet when the resistance value of the equivalent busbar-to-ground resistance for the at least one of the positive busbar and the negative busbar to which the grounding resistance providing unit is electrically connected is less than a predetermined threshold associated with the resistance value of the grounding resistance.

3. The grounding detection device according to claim 1, wherein the insulation tester comprises:
   a first positive busbar resistor electrically connected between the positive busbar and a ground wire;
   a first negative busbar resistor electrically connected between the negative busbar and the ground wire;
   a second positive busbar resistor, one terminal of the second positive busbar resistor connected to the positive busbar;
   a second negative busbar resistor, one terminal of the second negative busbar resistor connected to the negative busbar; and
   a switch unit, one terminal of the switch unit connected to the other terminal of the second positive busbar resistor and the other terminal of the second negative busbar resistor, and the other terminal of the switch unit connected to the ground wire.

4. The grounding detection device according to claim 3, wherein:
   the insulation tester is configured to obtain a first busbar-to-ground voltage for the positive busbar and a first busbar-to-ground voltage for the negative busbar when the switch unit is turned off,
   the insulation tester is configured to obtain a second busbar-to-ground voltage for the positive busbar and a second busbar-to-ground voltage for the negative busbar when the switch unit is turned on, and
   the insulation tester is configured to calculate the equivalent busbar-to-ground resistance for the positive busbar and the equivalent busbar-to-ground resistance for the negative busbar, based on resistance values of the first positive busbar resistor, the first negative busbar resistor, the second positive busbar resistor and the second negative busbar resistor, and based on the first busbar-to-ground voltage for the positive busbar, the first busbar-to-ground voltage for the negative busbar, the second busbar-to-ground voltage for the positive busbar and the second busbar-to-ground voltage for the negative busbar.

5. The grounding detection device according to claim 3, wherein the ratio of the resistance value of the first positive busbar resistor to the resistance value of the first negative busbar resistor is different from the ratio of the parallel resistance of the first positive busbar resistor and the second positive busbar resistor to the parallel resistance of the first negative busbar resistor and the second negative busbar resistor.

6. The grounding detection device according to claim 5, wherein the resistance value of the first positive busbar resistor is equal to the resistance value of the first negative busbar resistor, and the resistance value of the second positive busbar resistor is not equal to the resistance value of the second negative busbar resistor.

7. The grounding detection device according to claim 1, wherein the grounding resistance providing unit comprises:
   a first grounding resistor mounted in the second cabinet, the first grounding resistor electrically connected between a ground wire and one of the positive busbar and the negative busbar.

8. The grounding detection device according to claim 7, wherein the grounding resistance providing unit further comprises:
   a second grounding resistor electrically connected between the ground wire and the other one of the positive busbar and the negative busbar.

9. The grounding detection device according to claim 8, wherein the resistance value of the first grounding resistor is equal to the resistance value of the second grounding resistor.

10. The grounding detection device according to claim 8, wherein the second grounding resistor is mounted in the second cabinet.

11. The grounding detection device according to claim 8, wherein the second grounding resistor is mounted in a third cabinet different the second cabinet, and the insulation tester is configured to determine, based on the resistance values of the equivalent busbar-to-ground resistances and the grounding resistance, whether there is a ground fault for the insulation tester, the first cabinet, the second cabinet and the third cabinet.

12. The grounding detection device according to claim 7, wherein the grounding resistance providing unit further comprises:
   at least one other grounding resistor mounted in at least one other cabinet different from both of the first cabinet and the second cabinet, the at least one other grounding resistor electrically connected between the ground wire and one of the positive busbar and the negative busbar, and
   wherein the insulation tester is configured to determine, based on the resistance values of the equivalent busbar-to-ground resistances and the grounding resistance, whether there is a ground fault for the insulation tester, the first cabinet, the second cabinet and the at least one other cabinet.

13. The grounding detection device according to claim 1, wherein the insulation tester is configured to calculate an insulation busbar-to-ground resistance based on the resistance values of the equivalent busbar-to-ground resistances and the grounding resistance when it is determined that there is no ground fault for the insulation tester, the first cabinet and the second cabinet.

14. The grounding detection device according to claim 13, wherein the insulation tester is configured to calculate the insulation busbar-to-ground resistance according to an equivalent busbar-to-ground resistance obtained by connecting the insulation busbar-to-ground resistance and the grounding resistance in parallel.

15. The grounding detection device according to claim 13, wherein the insulation tester is configured to determine that there is an insulation fault when the insulation busbar-to-ground resistance is less than a predetermined threshold.

16. A grounding detection device, comprising:
   an insulation tester mounted in a first cabinet, the insulation tester electrically connected to a positive busbar and a negative busbar to detect an equivalent busbar-to-ground resistance of the positive busbar and an equivalent busbar-to-ground resistance of the negative busbar, the insulation tester grounded via the first cabinet; and
   a grounding resistance providing unit mounted at least in part in the first cabinet, the grounding resistance providing unit electrically connected to at least one of the positive busbar and the negative busbar to provide a grounding resistance between ground and at least one of the positive busbar and the negative busbar, the grounding resistance providing unit grounded via the first cabinet,
   wherein the insulation tester is configured to determine, based on resistance values of the equivalent busbar-to-ground resistances and the grounding resistance, whether there is a ground fault for the insulation tester.

17. A grounding detection method, comprising:
   mounting an insulation tester in a first cabinet, such that the insulation tester is electrically connected to a positive busbar and a negative busbar to detect an equivalent busbar-to-ground resistance of the positive busbar and an equivalent busbar-to-ground resistance of the negative busbar, the insulation tester grounded via the first cabinet;
   mounting at least part of a grounding resistance providing unit in a second cabinet different from the first cabinet, such that the grounding resistance providing unit is electrically connected to at least one of the positive busbar and the negative busbar to provide a grounding resistance between ground and at least one of the positive busbar and the negative bus bar, the grounding resistance providing unit grounded via the second cabinet; and
   determining, based on resistance values of the equivalent busbar-to-ground resistances and the grounding resistance, whether there is a ground fault for the insulation tester, the first cabinet, and the second cabinet.

18. The method according to claim 17, wherein the insulation tester comprises:
   a first positive busbar resistor electrically connected between the positive busbar and a ground wire;
   a first negative busbar resistor electrically connected between the negative busbar and the ground wire;
   a second positive busbar resistor, one terminal of the second positive busbar resistor connected to the positive busbar;
   a second negative busbar resistor, one terminal of the second negative busbar resistor connected to the negative busbar; and
   a switch unit, one terminal of the switch unit connected to the other terminal of the second positive busbar resistor and the other terminal of the second negative busbar resistor, and the other terminal of the switch unit connected to the ground wire, and
   the method further comprises:
   obtaining, by the insulation tester, a first busbar-to-ground voltage for the positive busbar and a first busbar-to-ground voltage for the negative busbar when the switch unit is turned off;
   obtaining, by the insulation tester, a second busbar-to-ground voltage for the positive busbar and a second busbar-to-ground voltage for the negative busbar when the switch unit is turned on; and
   calculating an equivalent busbar-to-ground resistance for the positive busbar and an equivalent busbar-to-ground resistance for the negative busbar, based on resistance values of the first positive busbar resistor, the first negative busbar resistor, the second positive busbar resistor and the second negative busbar resistor, and based on the first busbar-to-ground voltage for the positive busbar, the first busbar-to-ground voltage for the negative busbar, the second busbar-to-ground voltage for the positive busbar and the second busbar-to-ground voltage for the negative busbar.

19. A grounding detection method, comprising:
   mounting an insulation tester in a first cabinet, such that the insulation tester is electrically connected to a positive busbar and a negative busbar to detect an equivalent busbar-to-ground resistance of the positive busbar and an equivalent busbar-to-ground resistance of the negative busbar, the insulation tester grounded via the first cabinet;
   mounting at least part of a grounding resistance providing unit in the first cabinet, such that the grounding resistance providing unit is electrically connected to at least one of the positive busbar and the negative busbar to provide a grounding resistance between ground and at least one of the positive bus bar and the negative bus bar, the ground resistance providing unit grounded via the first cabinet; and
   determining, based on resistance values of the equivalent busbar-to-ground resistance and the grounding resistance, whether there is a ground fault for the insulation tester.

20. The method according to claim 19, wherein the insulation tester comprises:
- a first positive busbar resistor electrically connected between the positive busbar and a ground wire;
- a first negative busbar resistor electrically connected between the negative busbar and the ground wire;
- a second positive busbar resistor, one terminal of the second positive busbar resistor connected to the positive busbar;
- a second negative busbar resistor, one terminal of the second negative busbar resistor connected to the negative busbar; and
- a switch unit, one terminal of the switch unit connected to the other terminal of the second positive busbar resistor and the other terminal of the second negative busbar resistor, and the other terminal of the switch unit connected to the ground wire, and the method further comprises:
- obtaining, by the insulation tester, a first busbar-to-ground voltage for the positive busbar and a first busbar-to-ground voltage for the negative busbar when the switch unit is turned off;
- obtaining, by the insulation tester, a second busbar-to-ground voltage for the positive busbar and a second busbar-to-ground voltage for the negative busbar when the switch unit is turned on; and
- calculating an equivalent busbar-to-ground resistance for the positive busbar and an equivalent busbar-to-ground resistance for the negative busbar, based on resistance values of the first positive busbar resistor, the first negative busbar resistor, the second positive busbar resistor and the second negative busbar resistor, and based on the first busbar-to-ground voltage for the positive busbar, the first busbar-to-ground voltage for the negative busbar, the second busbar-to-ground voltage for the positive busbar and the second busbar-to-ground voltage for the negative busbar.

* * * * *